US007966359B2

(12) United States Patent
Brenner (10) Patent No.: US 7,966,359 B2
(45) Date of Patent: Jun. 21, 2011

(54) WIDEBAND FREQUENCY DISCRIMINATOR AND RADIOLOCALIZATION RECEIVER

(75) Inventor: Joel Brenner, Arzo (CH)

(73) Assignee: Qualcomm Incorporated, San Diego, CA (US)

( * ) Notice: Subject to any disclaimer, the term of this patent is extended or adjusted under 35 U.S.C. 154(b) by 1066 days.

(21) Appl. No.: 11/688,529

(22) Filed: Mar. 20, 2007

(65) Prior Publication Data

US 2007/0224965 A1  Sep. 27, 2007

(30) Foreign Application Priority Data

Mar. 22, 2006  (EP) .................................... 06111566

(51) Int. Cl.
 *G06F 17/10* (2006.01)
(52) U.S. Cl. ....................................................... 708/309
(58) Field of Classification Search .................. 708/309
 See application file for complete search history.

(56) References Cited

U.S. PATENT DOCUMENTS

| 4,797,677 | A | 1/1989 | MacDoran et al. |
| 5,291,081 | A | 3/1994 | Takeuchi et al. |
| 5,343,210 | A | 8/1994 | Marcuard |
| 5,663,734 | A | 9/1997 | Krasner |
| 5,721,555 | A | 2/1998 | Lennen |
| 5,781,156 | A | 7/1998 | Krasner |
| 6,044,105 | A | 3/2000 | Gronemeyer |
| 6,289,041 | B1 | 9/2001 | Krasner |
| 6,392,590 | B1 | 5/2002 | Kagemoto |
| 6,650,285 | B2 | 11/2003 | Jandrell |
| 6,750,814 | B1 | 6/2004 | Nir et al. |
| 6,772,065 | B2 | 8/2004 | Sanmiya et al. |
| 6,795,771 | B2 | 9/2004 | Fuchs et al. |
| 6,909,739 | B1 | 6/2005 | Eerola et al. |
| 6,931,055 | B1 | 8/2005 | Underbrink et al. |

FOREIGN PATENT DOCUMENTS

| EP | 0 788 225 A1 | 8/1997 |
| EP | 1696557 A1 * | 8/2006 |
| WO | WO 02/25829 A1 | 3/2002 |

OTHER PUBLICATIONS

J. J. Spilker, Jr., "GPS Signal Structure and Performance Characteristics", Navigation: Journal of the Institute of Navigation, Summer 1978, vol. 25, No. 2, pp. 29-54.
Mats Brenner, "Integrated GPS/Inertial Fault Detection Availability", Navigation: Journal of the Institute of Navigation, vol. 43, No. 2, 1996, pp. 339-358.
E. M. Copps et al., "Optimal Processing of GPS Signals", ION Annual Meeting, Jun. 1980, pp. 13-24.

(Continued)

*Primary Examiner* — Tan V Mai
(74) *Attorney, Agent, or Firm* — Howard Seo (57) ABSTRACT

A Frequency discriminator based on a combination of Discrete Fourier Transform (DFT) operator and half-bin DFT operator, corresponding to a set of Twiddle factors with frequency double than the sampling frequency. The frequency estimators are so chosen as not to have any zero or discontinuity point. Therefore the discriminator of embodiments of invention is more stable and well-behaved in an extended operating range. The discriminator of the invention, when applied to a Global Positioning System (GPS) receiver, allows a safer lock to the carrier frequency, even in presence of a large initial error, and avoids the problem of false locks.

44 Claims, 9 Drawing Sheets

OTHER PUBLICATIONS

D. B. Cox, Jr., "Integration of GPS with Inertial Navigation Systems", Navigation: Journal of the Institute of Navigation, Summer 1978, vol. 25, No. 2, pp. 144-153.

Christopher J. Hegarty, "Analytical Derivation of Maximum Tolerable In-Band Interference Levels for Aviation Applications of GNSS", Navigation: Journal of the Institute of Navigation, vol. 44, No. 1, 1997, pp. 349-367.

N. B. Hemesath, "Performance Enhancements of GPS User Equipment", Navigation: Journal of the Institute of Navigation, Summer 1978, vol. 25, No. 2, pp. 103-108.

E. H. Martin, "GPS User Equipment Error Models", $33^{rd}$ Annual Meeting of the Institute of Navigation, Jun. 23, 1977, pp. 109-118.

Peter C. Ould et al., "All-Digital GPS Receiver Mechanization", ION Aerospace Meeting, Apr. 1981, pp. 25-35.

Bernhard A. Schnaufer et al., "WAAS Receiver Carrier Tracking Loop and Data Demodulation Performance in the Presence of Wideband Interference", Navigation: Journal of the Institute of Navigation, vol. 44, No. 1, 1997, pp. 369-382.

Kai P. Yiu et al., "A Low-Cost GPS Receiver for Land Navigation", Hewlett-Packard Laboratories, May 1982, pp. 44-60.

\* cited by examiner

WIDEBAND FREQUENCY DISCRIMINATOR AND RADIOLOCALIZATION RECEIVER

REFERENCE DATA

This application claims priority of European Patent application 06111566.3 filed Mar. 22, 2006, the contents of which are hereby incorporated by reference.

FIELD OF THE INVENTION

Embodiments of the current invention relate to a method of estimating the frequency of a signal, and to a corresponding device. In particular, but not exclusively, embodiments of the present invention relate to the application of the aforementioned method and device to the acquisition and tracking of localization signal such as, for example, the signal emitted from one or more GPS (Global Positioning System) satellites, or the signal involved in another radio localization system.

DESCRIPTION OF RELATED ART

The frequency estimate, in particular the frequency estimate of sinusoidal signals, is an operation used in a large number of applications.

Functionally speaking, the term frequency discriminator is employed here to indicate an algorithm or a mathematical operation that, applied to a vector representing a sampled signal, is able to estimate the fundamental frequency of the signal itself. Similarly, the term frequency discriminator may also indicate, in the context of this invention, a portion of software for determining the frequency of a signal represented for example by a series of time samples. The term frequency discriminator also designates in the following, when referring to a device, an element of electronic circuitry arranged or programmed in a manner as to estimate the fundamental frequency of an analogue or digital signal present to its input.

Figure 1:
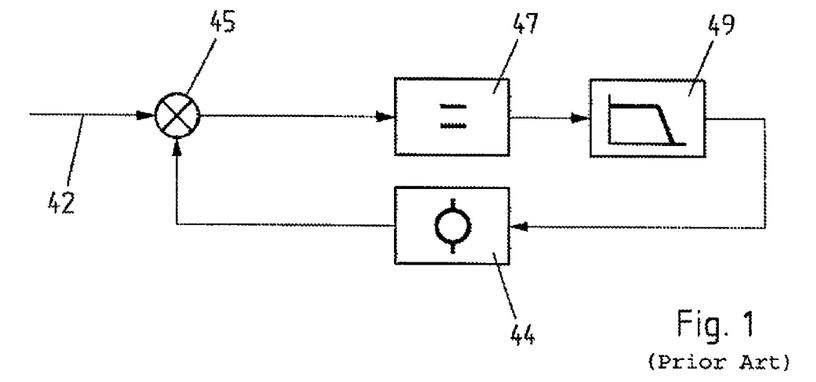
FIG. 1 diagrammatically shows a known FLL including a frequency discriminator.

An example of utilization of a frequency discriminator is the FLL (Frequency Locked Loop) represented schematically in FIG. 1. In this example an incoming signal 42 is combined with the signal of a local oscillator 44 in a mixer 45. The resulting difference frequency is applied to a frequency discriminator 47. The result of the frequency discriminator is in principle proportional to the difference between the fundamental input frequency and a nominal frequency, and is used to drive the local oscillator in a feedback loop comprising the filter 49 so that it is tuned at the same frequency as the received signal.

An important application of frequency discriminator is in the carrier tracking loop of GPS receivers. The operation of GPS receivers usually comprises an acquisition mode, in which the signal received from the Space Vehicles (SV) are searched, and a tracking mode, in which the acquired signals are followed both in carrier frequency or phase and in code phase.

The frequency of the signal received from SV in a GPS system is in principle affected by a number of instrumental errors, for example frequency bias and drift of the local oscillators, as well as by a physical Doppler shift, related to the relative speed between the SV and the receiver, which must be appropriately measured, in order to maintain tracking of the SV and arrive at a position determination. This is commonly realized, in GPS receivers, by means of PLL (Phase Locked Loop) and FLL feedback loops.

Typically, the FLL loop is used during the acquisition phase, by reason of its superior noise immunity. The PLL provides better tracking performance when the signal strength is adequate. A FLL fallback mode is often provided, as a substitute of the PLL, for tracking weak signals, and during dynamic peaks due to the motion of the receiver.

In a large number of applications the frequency estimation is done by applying the frequency mathematical definition of the frequency as the time-derivative of the phase, $f=\dot{\phi}$. The incremental ratio of the phase is then taken as an estimator of the frequency.

$$f(x, t_n) = \frac{\varphi(x, t_n) - \varphi(x, t_{n-1})}{\Delta t_{n;n-1}} \qquad 1)$$

This approach, however, is not practically available when noise exceeds a certain threshold, in which case the phase signal is not clearly detectable.

Another common approach is to use time-domain frequency discrimination, as will be described in the following. Such discriminators, unfortunately, exhibit a rather narrow locking frequency range and spurious zero or discontinuity points outside the locking range. When such discriminators are employed in a frequency control loop, the external zero or discontinuity points generate spurious stable locking position outside of the design locking range. The time domain-based phase derivative discriminator described above is also affected by the same problem.

Another possible method implies the extraction of one or more DFT (Discrete Fourier Transform) of the input signal. Such partial amplitudes can be mathematically combined in various ways to provide the desired frequency. Known DFT frequency discriminators are however affected by nonlinearities and out of range zero or discontinuity points, and therefore share the limitation of the previous devices.

It is a goal of embodiments of the present invention to provide a frequency discriminator which is free from the above shortcomings, and in particular to provide a frequency discriminator having an extended locking range, and which is stable within its locking range.

A further goal of embodiments of the present invention is to provide a frequency discriminator without spurious locking point outside the locking range.

It is a further goal of embodiments of the invention to provide a frequency control circuit having an improved precision, as well as a radio localization receiver employing it.

BRIEF SUMMARY OF THE INVENTION

A first embodiment relates to a method of obtaining a frequency difference between an input signal comprising a number of N successive samples and a reference frequency, comprising the steps of: applying to a number of N successive samples a discrete number of spectral components extraction operators for extracting corresponding spectral components of an input signal, combining mathematically the spectral components to a lower amplitude operator having a maximum of its transfer function at a lower frequency, and a upper amplitude operator having a maximum of its transfer function at a upper frequency higher than the lower frequency above the reference frequency, obtaining the frequency difference from the value of the lower amplitude operator and upper amplitude operator, wherein the response of lower amplitude operator and upper amplitude operator exhibits no zeros or discontinuities in the operating frequency range. A further aspect is the method wherein the response of the lower and upper operators exhibits no zeros or discontinuities at any frequency. A still further aspect comprises the method wherein the upper frequency and the lower frequency are symmetrically placed around the reference frequency. Another aspect comprises the method wherein the reference frequency is the zero frequency. A still further aspect comprises the method wherein the lower and upper operators comprise a step of calculating an absolute value of the output.

A further aspect comprises the method wherein each of the lower and upper operators is a combination of a DFT operation, obtained by a linear combination of the N successive samples, with weight factors taken from N distinct complex roots of unity of order N, and of a Half-bin DFT operation, obtained by a linear combination of the N successive samples, with weight factors taken from 2N distinct complex roots of unity of order 2N. Another aspect comprises the method wherein the frequency difference is obtained by the sole values of the lower and upper operators. Yet another aspect comprises the method wherein the frequency difference is obtained by the lower and upper operators and from the value of one or more DFT operators and half-bin DFT operators. A further aspect comprises the method wherein at least one of the DFT operators corresponds to the reference frequency.

Additional embodiments of the invention relate to a frequency discriminator device, comprising an input, for receiving an input signal, and frequency discriminator means for generating an output signal dependent on a difference from a fundamental frequency of the input signal and a reference frequency; wherein the frequency discriminator means comprises a frequency extraction means for extracting a discrete spectral components of the input signal, at a lower frequency and at an upper frequency, the upper frequency and the lower frequency being placed above and under the reference frequency, the response of the frequency discriminator device being determined from the discrete spectral components of the input signal, at a lower frequency and at a upper frequency wherein the response of the frequency extraction means does not go to zero for any frequency in the operating frequency range. Optionally the reference frequency is the zero frequency. The device can be in combination with a variable frequency source, a mixer for combining an input frequency with an output of the variable frequency source, the discriminator comparing an output signal of the mixer and generating a frequency error signal, for driving the variable frequency source and locking it to the input frequency, so as to constitute a frequency control device.

Additionally, the frequency discriminator device can be made such that the input signal comprises a number of N successive samples such that each of the frequency extraction means is operatively arranged to perform a combination of a DFT operation, obtained by a linear combination of the N successive samples, with weight factors taken from N distinct complex roots of unity of order N, and of a Half-bin DFT operation, obtained by a linear combination of the N successive samples, with weight factors taken from 2N distinct complex roots of unity of order 2N. Optionally, the frequency difference is obtained by the sole output values of one lower frequency extraction means, arranged to extract discrete spectral components of the input signal, at a lower frequency than the reference frequency, and of one upper frequency extraction means, arranged to extract a discrete spectral components of the input signal, at a higher frequency than the reference frequency.

Still another embodiment of the invention relates to a GPS receiver, including a frequency discriminator section, for generating an output signal dependent on the difference from a fundamental frequency of an input signal of the frequency discriminator section and a reference frequency; wherein the frequency discriminator section comprises frequency extraction means for extracting a discrete spectral components of the input signal, at a lower frequency and at a upper frequency, the upper frequency and the lower frequency being placed respectively above and under the reference frequency, the response of the frequency discriminator section being determined from discrete spectral components of the input signal, at a lower frequency and at a upper frequency the response of the frequency extraction means does not go to zero for any frequency in the operating frequency range.

BRIEF DESCRIPTION OF THE DRAWINGS

The embodiments of the invention will be better understood with the aid of the description of an embodiment given by way of example and illustrated by the figures, in which.

DETAILED DESCRIPTION OF POSSIBLE EMBODIMENTS OF THE INVENTION

A well-known frequency discriminator, widely used, for example in radio localization receivers, is the simple "cross" discriminator, which is expressed by the formula:

$$\text{Cross} = I_1 \cdot Q_2 - I_2 \cdot Q_1 \qquad 2)$$

where $I_1$, $I_2$ are the real components of a complex sinusoidal signal at two times $T_1 < T_2$, and $Q_1$ and $Q_2$ are the corresponding imaginary components of the same signal at the same times $T_1$ and $T_2$. The observation time $\Delta T = T_2 - T_1$ is related to the nominal locking range $$W_{Cross} = \frac{1}{2 \cdot \Delta T}.$$

Figure 16:
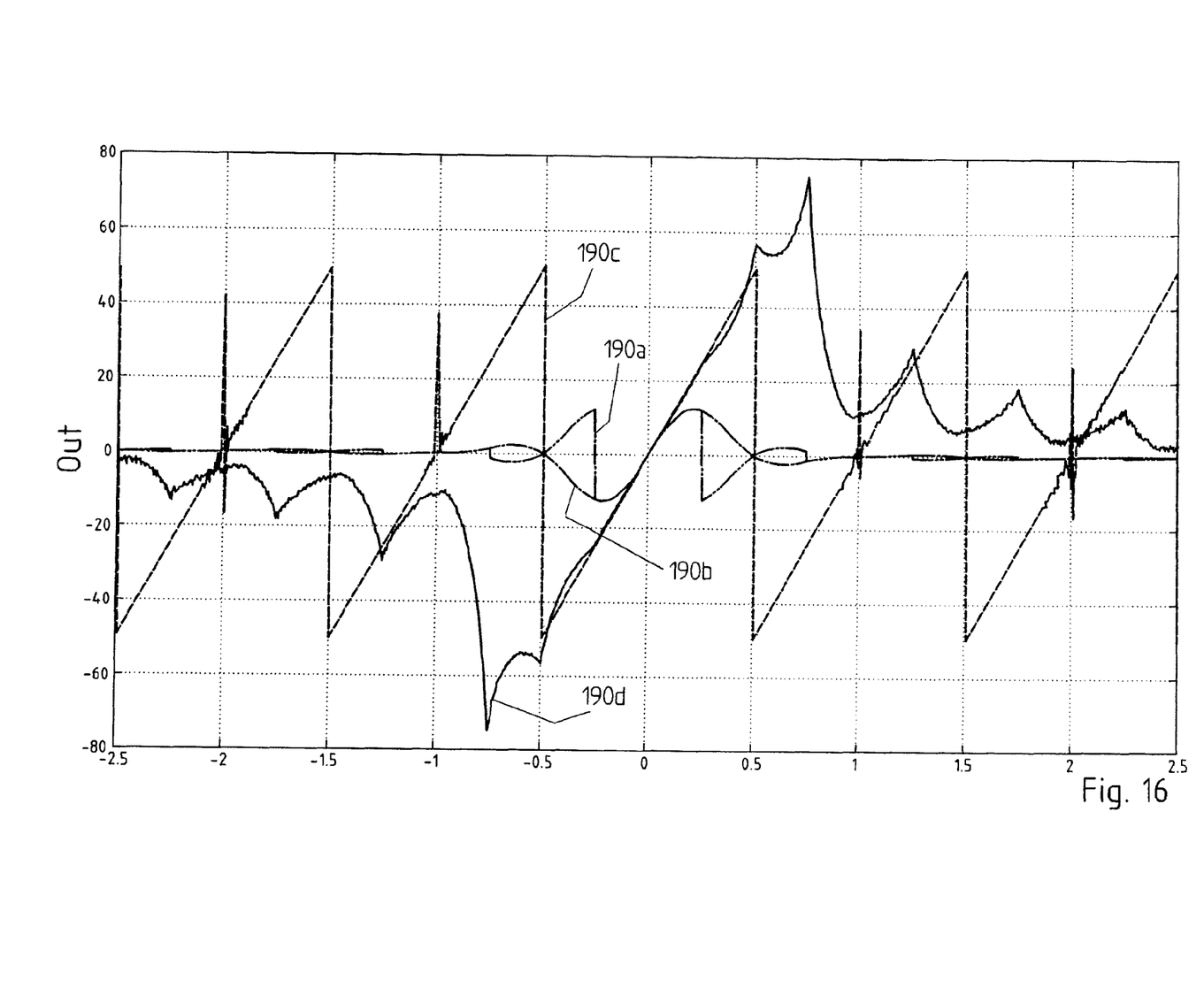
FIG. 16 is a diagrammatic comparison of the response of some frequency discriminators according to embodiments of the present invention and of some frequency discriminators belonging to the state of the art.

With reference to FIG. 16, together with the output 190d of a discriminator according to the invention, the response of the "cross" discriminator is represented by the curve 190b. It can be appreciated that, while it is well-behaved within its locking range, the output of the "cross" discriminator presents stable locking zeros outside of its locking range.

FIG. 16 also presents other known variants of this class of discriminator, the "signDotCross" discriminator, corresponding to curve 190a $$Dot = I_1 \cdot I_2 + Q_1 \cdot Q_2$$

$$SignDotCross = Sign(Dot) \cdot Cross \qquad 3)$$

and the arctangent discriminator, whose output is exemplified by curve 190c $$AtanDisc = \arctan 2(Cross, Dot) \qquad 4)$$

Both these discriminators exhibit zero or discontinuity points, which correspond to false locking points outside the operating range.

It is known to use Discrete Fourier Transform (DFT) to realize a frequency discriminator on digital signals. Conceptually, this class of discriminators is based on the principle of comparing the output of at least two distinct DFT operations, centred at different frequencies.

The DFT is a discrete estimation of a single spectral component of an input signal, equivalent to one single element of a Fourier transform.

More precisely, if $\{x_i\}$ is a discrete sequence of complex values, corresponding to N samples of a complex signal, the channel-k DFT of $\{x_i\}$ is defined by $$DFT(x, k) = \sum_{i=0}^{N-1} x_i \cdot \left( \sin\left(\frac{2\pi \cdot k \cdot i}{N}\right) + j \cdot \cos\left(\frac{2\pi \cdot k \cdot i}{N}\right) \right), \qquad 5)$$

$$-N \le k < N$$

or, in compact form $$DFT(x, k) = \sum_{i=0}^{N-1} x_i W_N^{k,i} \qquad 6)$$

where $$W_N^{k,i} = e^{-j\frac{2\pi \cdot k \cdot i}{N}} \qquad 7)$$

The DFT can therefore be regarded as a linear combination of the samples $x_i$ in which the weights W, also indicated as "Twiddle factors", are the N distinct roots of order N of unity in the complex field, taken in increments of k. For a "two sided" spectrum k one may assume both negative and positive integer values ($-N \le k \le N$).

According to the known frequency shift theorem, the expression 6) above can be also interpreted as an average of a sequence of frequency shifted sinusoids. In fact the term 7) is a complex sinusoid with frequency $$\frac{k}{NT}.$$

The product $x_i W_N^{k,i}$ just shifts the spectrum of $x_i$ backwards on the frequency axis by an amount of $$\frac{k}{NT},$$

leaving the spectral shape of $x_i$ in itself unchanged. The average operation in the frequency domain has the following transfer function:

$$Avg_{TF}(f, N) = N \frac{\sin(2 \cdot \pi \cdot f)}{2 \cdot \pi \cdot f} = N \cdot \text{sinc}(2 \cdot \pi \cdot f) \qquad 8)$$

where f is the frequency and N is the number of samples.

The transfer function of the DFT operator can therefore be obtained by multiplying the spectrum of the "frequency shifted" signal with the average transfer function 8):

$$|DFT(f)| = N \cdot \left| \frac{\sin\left(2 \cdot \pi \cdot \left(f \cdot T - \frac{k}{N}\right)\right)}{2 \cdot \pi \cdot \left(f \cdot T - \frac{k}{N}\right)} \right| = \text{with } -N < k < N \qquad 9)$$

$$= N \cdot \left| \text{sinc}\left(f \cdot T - \frac{k}{N}\right) \right|$$

where T represents the sampling period, f is the frequency of the sinusoidal signal, N is the number of samples used in the DFT and k is the discrete position of the DFT central frequency, expressed as number of $1/(N \cdot T)$ units as discussed above.

Figure 2:
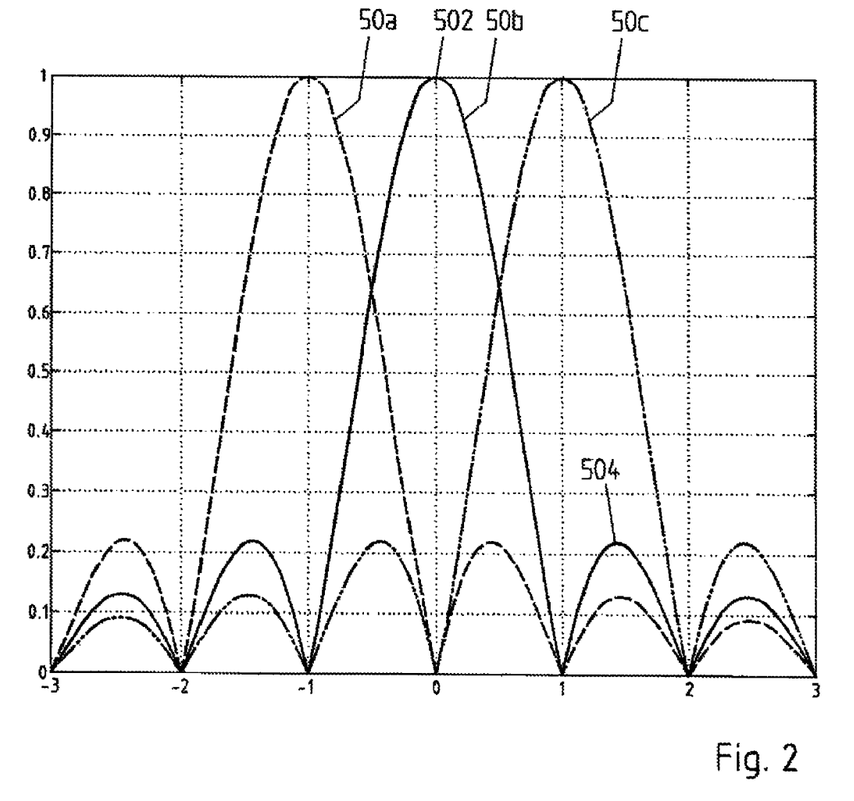
FIG. 2 represents the absolute value of the transfer function of three DFT operations centred on three adjacent frequency bins.

Referring now to FIG. 2, it is possible to appreciate the frequency response of three distinct DFT operators 50a, 50b and 50c, centred on three consecutive frequency bins corresponding to $n=-1$, $n=0$, and $n=1$, respectively.

The response of each DFT has thus a central peak 502 at $f=k/NT$, and secondary maxima 504. The response of the DFT operator is strictly zero for any frequency multiple of the DFT bin width 1/NT, apart the central peak frequency.

The extraction of the absolute value is used to extract the real non-negative amplitude value of the complex DFT output.

A possible manner of building a DFT frequency estimator involves the evaluation of the quantity $$f_x = \frac{DFT_D(x) - DFT_U(x)}{DFT_D(x) + DFT_U(x)} \qquad 10)$$

where $DFT_D$ and $DFT_U$ stand for the operators $|DFT(x,-1)|$ and $|DFT(x,+1)|$ that is to say, the DFT corresponding to curves 50a and 50c of FIG. 2, or, explicitly $$DFT_U(x) = \sum_{i=0}^{N-1} x_i \cdot e^{-j\frac{2\pi \cdot i}{N}} \quad 11)$$

$$DFT_D(x) = \sum_{i=0}^{N-1} x_i \cdot e^{-j\frac{2\pi \cdot i}{N}}$$

or $$DFT_U(x) = \sum_{i=0}^{N-1} x_i \cdot W_N^i$$

$$DFT_D(x) = \sum_{i=0}^{N-1} x_i \cdot W_N^{-i}$$

In the discriminator of equation 10), the frequency is estimated by means of the amplitude difference between the two DFT having k=+1 and k=−1. The difference is then normalized using the sum of the two DFT amplitudes.

Figure 3:
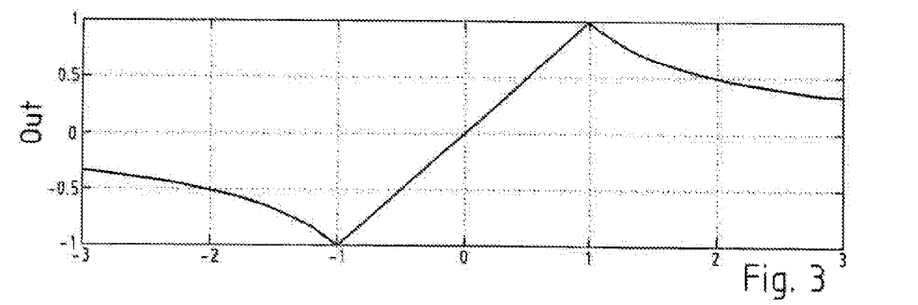
FIG. 3 shows the response of a frequency discriminator based on two of the DFT of FIG. 2, in ideal noiseless conditions.
Figure 4:
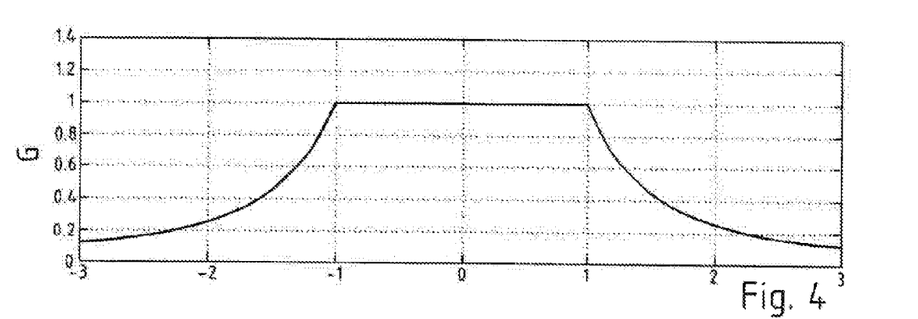
FIG. 4 shows the gain of the discriminator of FIG. 3.

FIGS. 3 and 4 show the theoretical response of the discriminator of equation 10), and the relative gain. An advantage of this discriminator is that the response is strictly linear, i.e. the gain is constant, in the frequency range from f=−1/(NT) to f=1/(NT).

Figure 5:
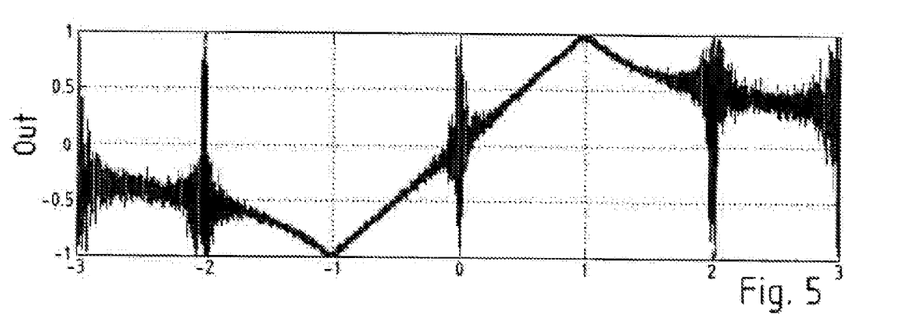
FIG. 5 shows the behaviour of the discriminator of FIG. 3 in presence of normal distributed noise.

A strong limitation of this approach is however that, in the frequency region close to f=0, both DFT are tending to zero, making the difference noise dominated. This problem is amplified by the fact that the normalization factor also tends to zero, due to the shape of the response R. The result is therefore mathematically undetermined in the vicinity of f=0. FIG. 5 shows the same response as FIG. 3, but with the addition of simulated random noise in the input signal. It is apparent that this discriminator provides essentially random result for frequencies close to f=0.

The discriminator of equation 10) has therefore a point of instability in the middle of its frequency range and is therefore useless in most practical applications. A way to obviate to this problem is to add the DFT 50c corresponding to k=0 in the normalization factor thus:

$$DFT_{centre}(x) = \sum_{i=0}^{N-1} x_i \cdot e^{-j\frac{2\pi \cdot i \cdot 0}{N}} \quad 12)$$

$$f_x = \frac{DFT_D(x) - DFT_U(x)}{DFT_D(x) + DFT_{centre}(x) + DFT_U(x)} \quad 13)$$

Figure 6:
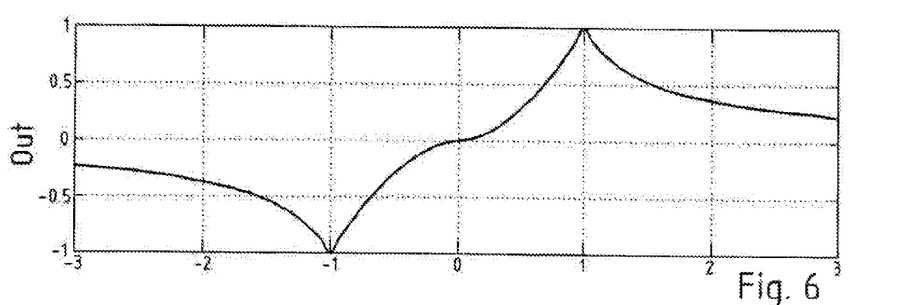
FIG. 6 shows the response of a frequency discriminator based on the three DFT of FIG. 2, in ideal noiseless conditions.
Figure 7:
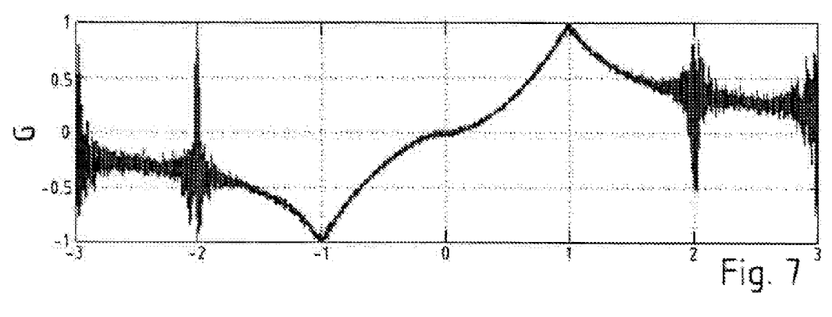
FIG. 7 shows the behaviour of the frequency discriminator of FIG. 6, in presence of normal distributed noise.

The response of discriminator of equation 13) is shown in FIG. 6 and, with the addition of simulated noise, in FIG. 7. Noise immunity is now satisfactory, however the discriminator has essentially no gain for frequencies very close to f=0. In some applications this fact can be penalizing, in particular it will induce a hysteresis in the FFL loop of FIG. 1.

According to an aspect of the present invention, the frequency discriminator comprises the evaluation of two Half-bin Discrete Fourier Transform (HDFT) at different frequencies, wherein the half-bin DFT are defined by formula (3) above, in which the index k takes a half/integer value.

In particular:

$$HDFT(x, -1/2) = \sum_{i=0}^{N-1} x_i \cdot W_N^{-i/2} \quad 14)$$

$$HDFT(x, 1/2) = \sum_{i=0}^{N-1} x_i \cdot W_N^{i/2}$$

However, examination of the expression defining the twiddle factors W reveals that $$W_N^{\frac{k}{2} \cdot i} = W_{2 \cdot N}^{k \cdot i} \quad 15)$$

The HDFT is thus calculated in the same manner as the ordinary DFT, but the twiddle factors W are taken as if the order of the Fourier transform was 2N, instead of N.

The transfer function of the HDFT (in absolute value) is still given by equation 9). It can be observed that the transfer function of HDFT operators have a maximum at a half/integer frequency value, with reference to the sampling frequency of the sample set ($x_i$), whereas the DFT operators defined before have maxima at integer frequency values.

More precisely we define:

$$HDFT_U(x) = \sum_{i=0}^{N-1} x_i \cdot e^{-j\frac{2\pi \cdot i}{2N}} \quad 16)$$

$$HDFT_D(x) = \sum_{i=0}^{N-1} x_i \cdot e^{j\frac{2\pi \cdot i}{2N}}$$

or $$HDFT_U(x) = \sum_{i=0}^{N-1} x_i \cdot W_{2N}^i$$

$$HDFT_D(x) = \sum_{i=0}^{N-1} x_i \cdot W_{2N}^{-i}$$

The formulation of the frequency discriminator becomes then:

$$f(x) \cong \frac{|HDFT_D(x)| - |HDFT_U(x)|}{|HDFT_D(x)| + |HDFT_U(x)|} \quad 17)$$

However, the peak frequencies are centred on half-integer values of the DFT bin width 1/NT.

The frequency extraction operators $H_D$ and $H_U$ involve the linear combination of the samples $x_i$ with weights, or twiddle factors, which are N complex roots of unity from the 2N distinct roots of unity of order 2N.

Figure 8:
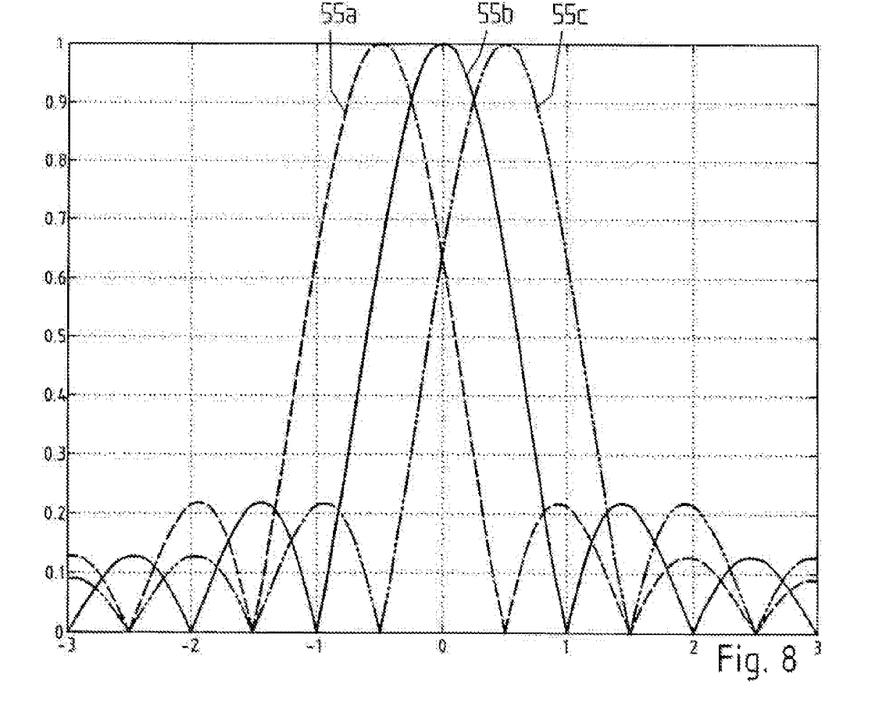
FIG. 8 shows the absolute value of three DFT operations shifted of half frequency bin.

FIG. 8 shows for example the response HDFT 55a corresponding to k=−1/2 and 55c, corresponding to k=1/2. Curve 55b, corresponding to k=0 is identical to curve 50b of FIG. 2.

Figure 9:
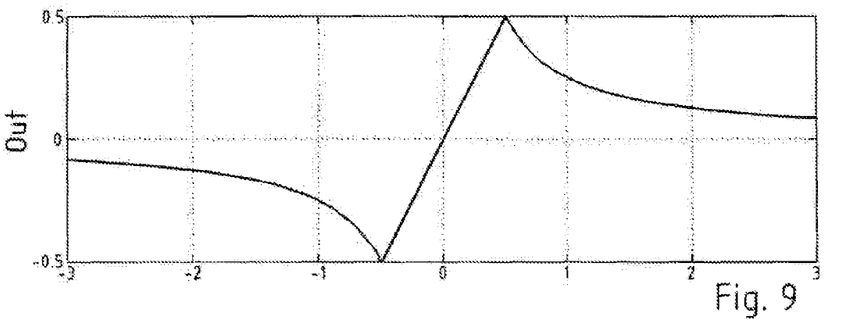
FIG. 9 shows the response of a frequency discriminator based on the two extreme DFT of FIG. 8.
Figure 10:
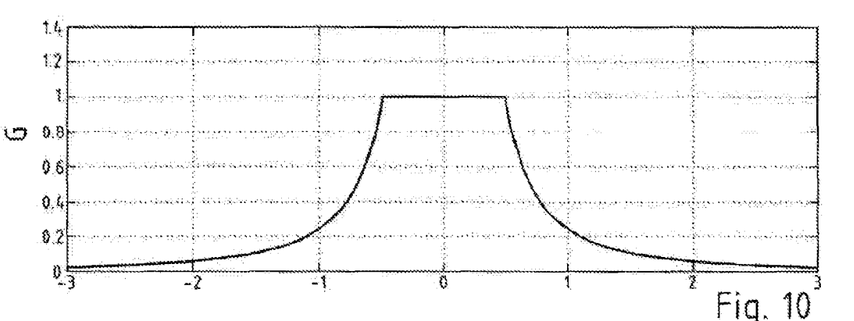
FIG. 10 shows the gain of the discriminator of FIG. 9.

It will be appreciated that, in contrast with DFT curves of FIG. 2, the curves 55a and 55c do not go to zero simultaneously for f=0. This allows the construction of a half-bin frequency discriminator with the response and the gain shown in FIGS. 9 and 10.

Figure 11:
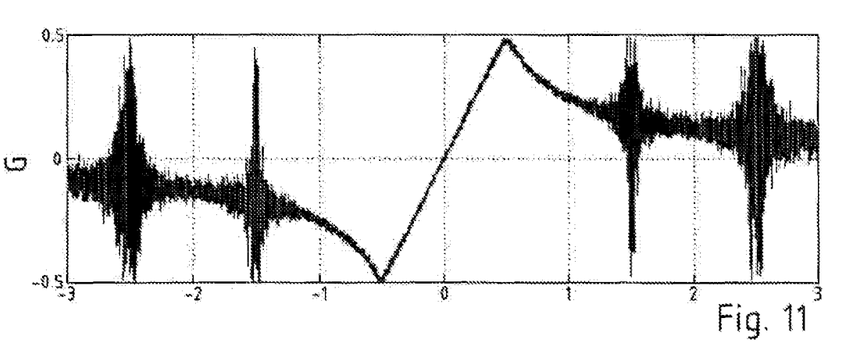
FIG. 11 shows the behaviour of the frequency discriminator of FIG. 9, in presence of normal distributed noise.
Figure 12:
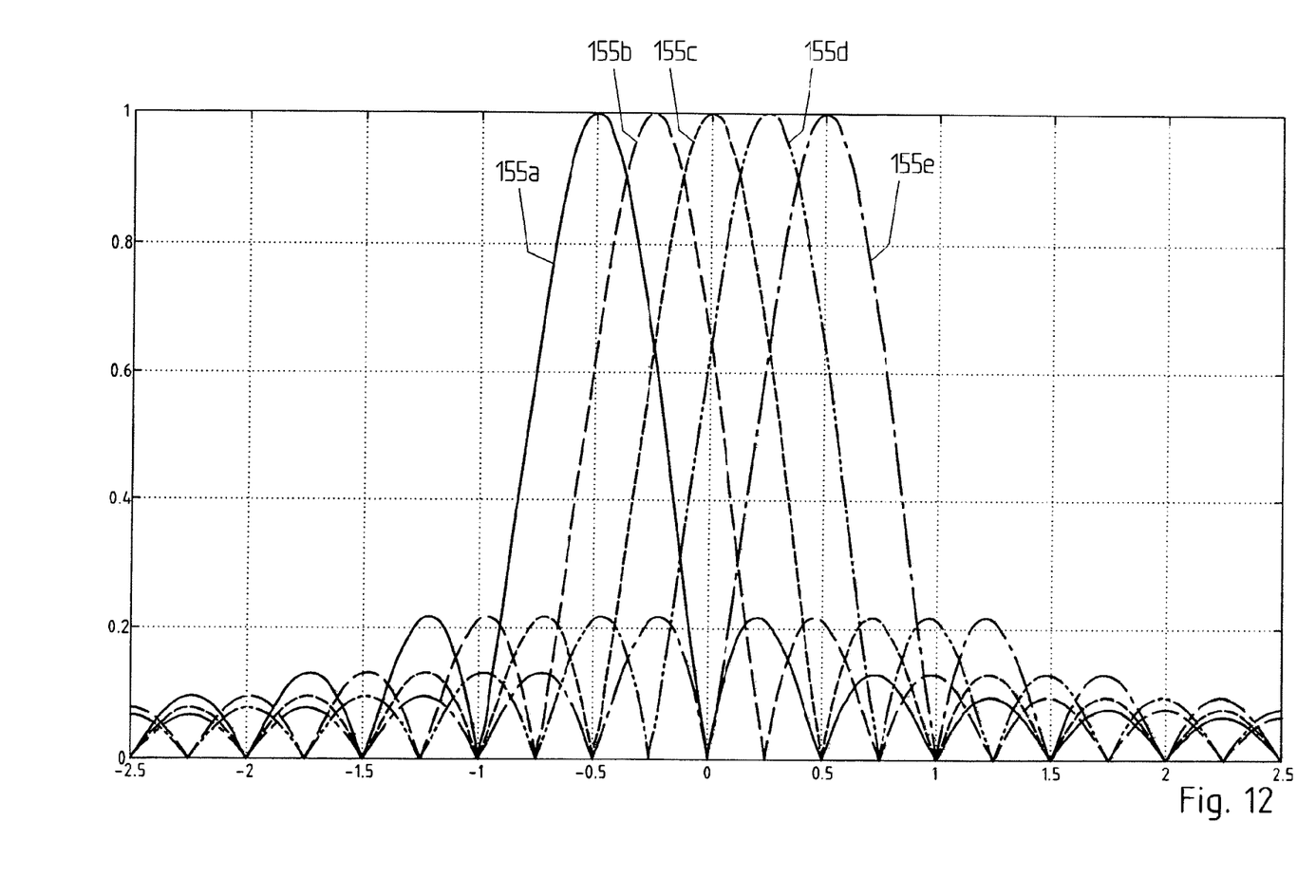
FIG. 12 represents the absolute value of five DFT operations shifted of half frequency bins.

Advantageously, the half-bin discriminator of the invention exhibits a linear response along all the operating range going from $f_D=-1/2NT$ to $f_U=1/2NT$ and is stable in the entirety of his operating range, since the denominator of equation 17) is not tending to zero for f=0. FIG. 11 shows the behaviour of the half-bin discriminator of the invention, in presence of normal distributed noise.

The mathematical formulation of the "Half Bin DFT" can also be deduced from a particular characteristic of the FFT algorithm. A complex FFT takes a vector of N samples of a signal and calculates N spectral lines at j/NT for $0 \leq i < N$. Sometimes, in order to artificially enhance the resolution of the calculated spectra, an FFT of 2N points is calculated adding N zeros at the end of the input sample vector. This operation, generates N new spectral lines placed at (2i+1)/2NT for $0 \leq i < N$ placed exactly in the middle of two N FFT frequency bins. Considering that the FFT algorithm is nothing more than an optimization and a reorganization of a bank of N DFTs we can deduce the formulation of the half bin DFT by replacing the spectral lines 1 and 2N-1 (negative frequency) of a 2N points FFT with this equivalent DFT. The 2N point DFT for k=1 and k=2N-1 becomes:

$$DFT(x, k=1; 2N-1) = \sum_{i=0}^{2N-1} x_i \cdot e^{-j\frac{2\pi \cdot k \cdot i}{2N}} \quad \frac{N}{2} < k < \frac{N}{2} \qquad 18)$$

$$DFT(x, k=1; 2N-1) = \sum_{i=0}^{2N-1} x_i \cdot W_{2N}^{k \cdot i}$$

but considering that the last N points of the input vector are zeros:

$$DFT(x, k=1; 2N-1) = \sum_{i=0}^{N-1} x_i \cdot e^{-j\frac{2\pi \cdot k \cdot i}{2N}} \quad -\frac{N}{2} < k < \frac{N}{2} \qquad 19)$$

$$DFT(x, k=1; 2N-1) = \sum_{i=0}^{2N-1} x_i \cdot W_{2N}^{k \cdot i}$$

This last formulation is exactly the same as the formulation of the half bin DFT previously deduced.

According to one aspect of the invention, the frequency discriminator thus comprises the steps of calculating at least two discrete spectral components of an incoming signal, preferably two spectral components corresponding to two frequencies $f_D$ and $f_U$, symmetrically placed above and under the zero frequency.

Each spectral component is extracted by an operator $H_D$ or $H_U$, which has a maximum of its response for the desired spectral component $f_D$ and $f_U$. The response naturally decreases for different frequencies, but in a manner that the response does not go to zero for any intermediate frequency between $f_D$ and $f_U$. In particular the response of $H_D$ and $H_U$ does not go to zero at the intermediate point f=0.

Thanks to this feature, the discriminator of the invention can extract a frequency error signal, obtained by a step of calculating the difference of the absolute-value outputs of $HDFT_D$ and $HDFT_U$, divided by the sum of the absolute-value outputs of $HDFT_D$ and $HDFT_U$.

Since neither the sum nor the difference of the absolute-value outputs of $HDFT_D$ and $HDFT_U$ is allowed to go to zero in any point of the range between $f_D$ and $f_U$, the discriminator so obtained is well-behaved, even considering the inevitable influence of noise, and its value is linear between $f_D$ and $f_U$.

By using the HDFT operator described above, the frequencies $f_D$ and $f_U$ of $HDFT_D$ and $HDFT_U$ are $f_D=-1/2NT$ to $f_U=1/2NT$, that is they are centred on half-integer values with respect to the natural binning of the sequence of the N incoming digital data $\{x_i\}$, which are sampled at a T sampling rate.

In a preferred embodiment, the operators $HDFT_D$ and $HDFT_U$ have the form set out in equation 17) above. However, the operators $HDFT_D$ and $HDFT_U$ may also be obtained, according to the present invention, from different mathematical operators, for extracting a frequency component of the incoming signal, as the circumstances may require.

Despite its distinct advantages, the half bin discriminator described above still has the limitation of having instability points outside the frequency range, at frequency±1.5, ±2.5 and so on. It is possible, in particular if noise is high, that a FLL using such discriminator may lock on these spurious frequencies.

A way to avoid this problem is to create a frequency discriminator based on an upper operator and a lower operator, which have a peak of their transfer function for a frequency respectively above and under the reference frequency (here conventionally taken as the zero frequency), and exhibit no zeros or discontinuities in the operating frequency range.

Figure 15:
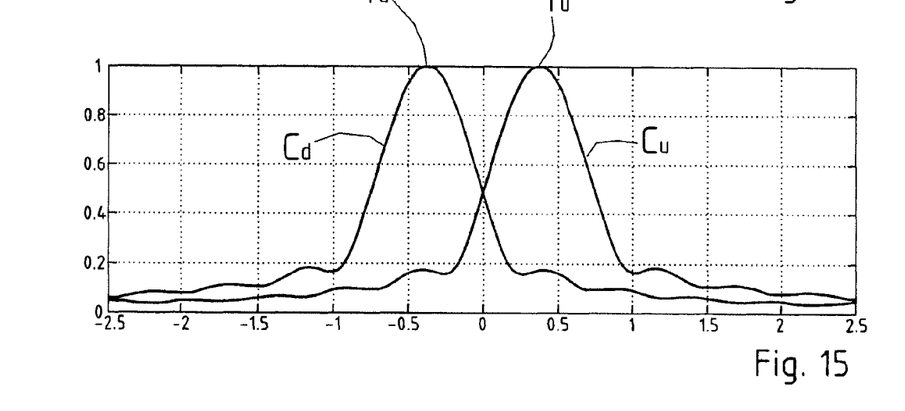
FIG. 15 represents the transfer function of two shifted compound operator used in the discriminator of FIG. 14.

A possible, but not exclusive, way of defining such upper and lower operator using both the $DFT_U$, $DFT_D$, defined by equations 11), and the $HDTF_U$, $HDFT_D$ defined in 16), is illustrated by operators $C_d$ and $C_u$ having the transfer function illustrated in FIG. 15 and the form:

$$C_D = |HDFT_D(x)| + |DFT_D(x)|$$

$$C_U = |HDFT_U(x)| + |DFT_U(x)| \qquad 20)$$

As desired, the lower compound operator $C_d$ has a maximum of its transfer function at a frequency $f_d$ below the reference frequency, marked as 0 in the graph of FIG. 15. The upper compound operator $C_u$, conversely has its maximum at a frequency $f_u$ above the reference frequency.

It can be seen that $C_D$ and $C_U$ have neither zeros nor discontinuities points in their whole range. It appears therefore that $C_D$ and $C_U$ may be used to create a frequency discriminator which is well-behaved both inside and outside the locking range.

Since $C_D < C_U$ for x<0 while $C_D > C_U$ for x>0, a simple example of discriminator according to the invention is provided by the following discriminator function:

$$\frac{C_U - C_D}{C_U + C_D} \qquad 21)$$

The performance of the above discriminator can be further improved, both in bandwidth and in linearity, by including in the denominator a term proportional $DFT_{centre}$ as defined in equation 12). An improved discriminator according to the invention is, for example, the following Half-bin symmetric DFT discriminator:

$$HSDFT(x) = \qquad 22)$$
$$\frac{1}{k_1}\left(\frac{|HDFT_U(x)| + |DFT_U(x)| - (|HDFT_D(x)| + |DFT_D(x)|)}{|HDFT_D(x)| + |HDFT_U(x)| + k_2 \cdot |DFT_{centre}(x)|}\right)$$

or, equivalently $$HSDFT(x) = \frac{1}{k_1}\left(\frac{C_U - C_D}{|HDFT_D(x)| + |HDFT_U(x)| + k_2 \cdot |DFT_{centre}(x)|}\right).$$

where the coefficients $k_1$ is a normalization factor, which can be chosen essentially at will, and $k_2$ is chosen to have an optimum compromised between bandwidth and linearity of the response. Good performance and a central gain equal to that of the other discriminators are obtained by $k_1 = \sqrt{1.75}$ and $k_2 = 3/2$, for example.

Figure 13:
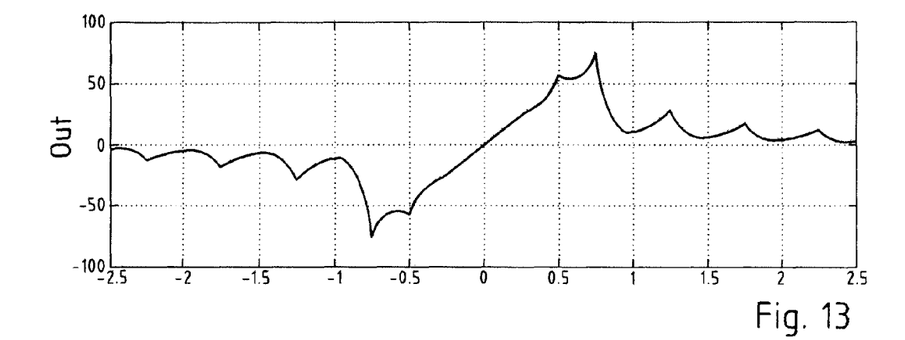
FIG. 13 shows the response of a frequency discriminator based on the DFT of FIG. 12.
Figure 14:
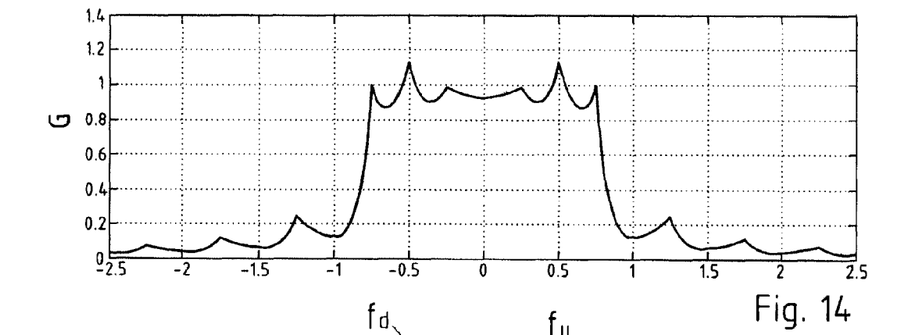
FIG. 14 represents the gain of a frequency discriminator based on the DFT of FIG. 12.

FIGS. 13 and 14 represent respectively the transfer function and the gain of the discriminator HSDFT(x) of equation 22). It can be appreciated that the gain is reasonably constant within the extended range of frequencies between −0.75 and 0.75. The locking range of the discriminator based on HSDFT (x) is then sensibly larger that the one of the other discriminators previously described.

Another advantageous feature is that there are neither zeros nor discontinuity or instability point in the whole frequency spectrum, even well beyond the locking range. This is even more apparent by examining the FIG. 16, in which the transfer function 190d of the discriminator HSDFT(x) according to the invention is compared with the transfer functions 190b of the "cross" discriminator, 190a of the "crossSign" discriminator and 190c of the "atan" discriminator. The comparison shows also the larger bandwidth of the transfer function 190d with respect to the known ones.

Thanks to these features of the embodiment it is possible to provide a frequency control device which converges to the target frequency faster and more precisely that devices base on known discriminators. In addition, it is possible to provide a frequency control device which has no spurious lock states.

Figure 17:
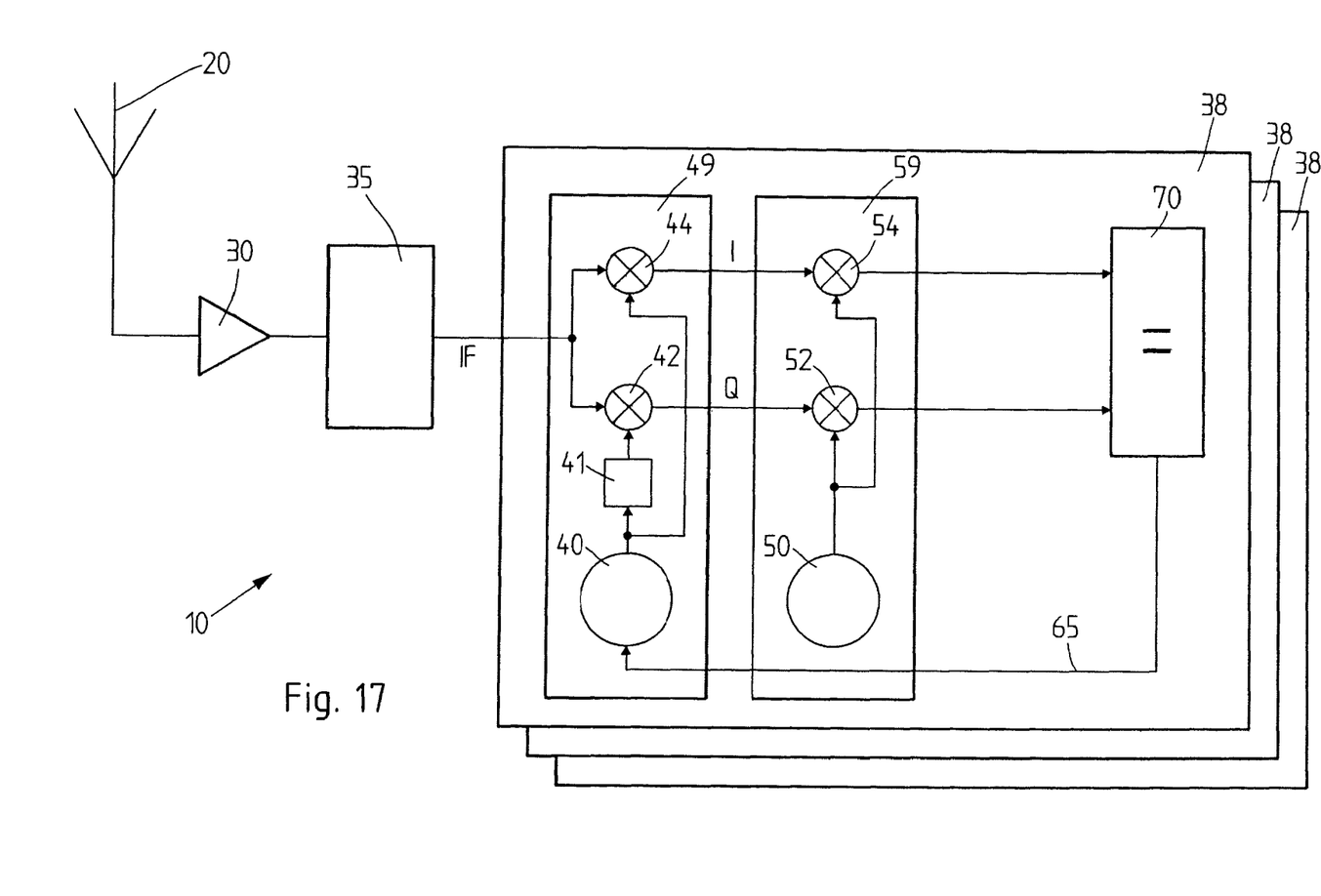
FIG. 17 schematically shows a receiving and tracking module of a GPS receiver according to an aspect of the present invention.

Embodiments of the present invention also relate to a receiver for a radio positioning system, in particular a GPS receiver, described now with reference to FIG. 17.

The receiver comprises a receiving antenna 20, adapted to the specific radio signal of the sources in the radio localization system. In a GPS system the sources are the orbiting GPS Space Vehicles, emitting a radio-localization signal at 1575.42 MHz. The signal received by the antenna is amplified by the low-noise amplifier 30 and down-converted to an intermediate frequency signal (IF signal) in the conversion unit 35, before being fed to the carrier removal stage 49. Other methods of processing the RF signal, including for example Analogue-to-Digital Conversion, are conventionally known and comprised in the present invention.

The IF signal is then fed, among others, to a correlation processor, whose function is to de-spread the signals received from each SV, and to align them temporally with locally generated copies of the pseudorandom ranging codes specific for each SV, for example, in case of a GPS receiver, the correlation processor has the task of demodulating and tracking the coarse acquisition (C/A) GPS ranging signals. To perform such alignment, the correlator's processor comprises an array of tracking modules 38, each of which is dedicated, for example to the acquisition and the tracking of a specific SV.

The various functions of the tracking modules 38 are described in the following with reference to the FIG. 17. It is to be understood, however, that this description is given by way of example only, and should not be interpreted as a limitation of the present invention. In particular the various elements and modules described must be understood in functional terms, and do not necessarily correspond to physical circuit elements. In particular several functions may be carried out by software modules, executed by one or more digital processors.

Also, even if the various tracking modules 38 are here described as totally independent and parallel, for the sake of clarity, it must be understood, however, that some features or resources can be shared among tracking modules, as the circumstances require.

Each tracking module has a carrier removal stage 49 comprising, conventionally, a local NCO 40, for generating a local oscillator signal, and a 90° phase shifter 41, producing a quadrature replica of the local oscillator signal. In a possible variant, the 90° phase shift may be done in a external front-end circuit. The incoming radio signal is multiplied with the in-phase and with the quadrature local oscillator signal in the multipliers 44, respectively 42, to produce a baseband in-phase signal I and a baseband quadrature signal Q. In tracking mode, the frequency or phase of the NCO 40 is locked to the carrier frequency or phase of the tracked SV.

Each tracking module 38 comprises also a local Gold pseudorandom code generator 50, for generating a local replica of the C/A code corresponding to a particular GPS Space Vehicle. The Gold pseudorandom codes can be generated internally, for example by a tapped shift register, or, equivalently, extracted from a preloaded table or by any other technique.

The Gold code generator 50 comprises an independent numerically controlled C/A clock whose frequency is set to produce a C/A code at a chipping rate of 1.023 MHz. The two in-phase (I) and quadrature (Q) components of the IF signal are multiplied by multipliers 52, 54 with the local C/A code. During tracking the local C/A code needs to be time-locked to the C/A code received from the SV. The local carrier frequency and phase need to be locked to the frequency and phase of the carrier of the received signal, to compensate for Doppler shift on the SV signal and local oscillator frequency drift and bias.

The correlation data for the in-phase signal and for the quadrature signal can be regarded as the real and imaginary parts of a complex signal. In an ideal frequency lock condition, the frequency of the NCO 40 and the frequency of the carrier are identical, and the signal present at the input of the discriminator 70 is a pure baseband signal, whose fundamental frequency is zero. During tracking the discriminator module 70 produces a frequency error signal 65 which is used for driving the NCO 40 of the carrier removal stage in a feedback loop, in order to lock to the frequency of the received signal.

Figure 18:
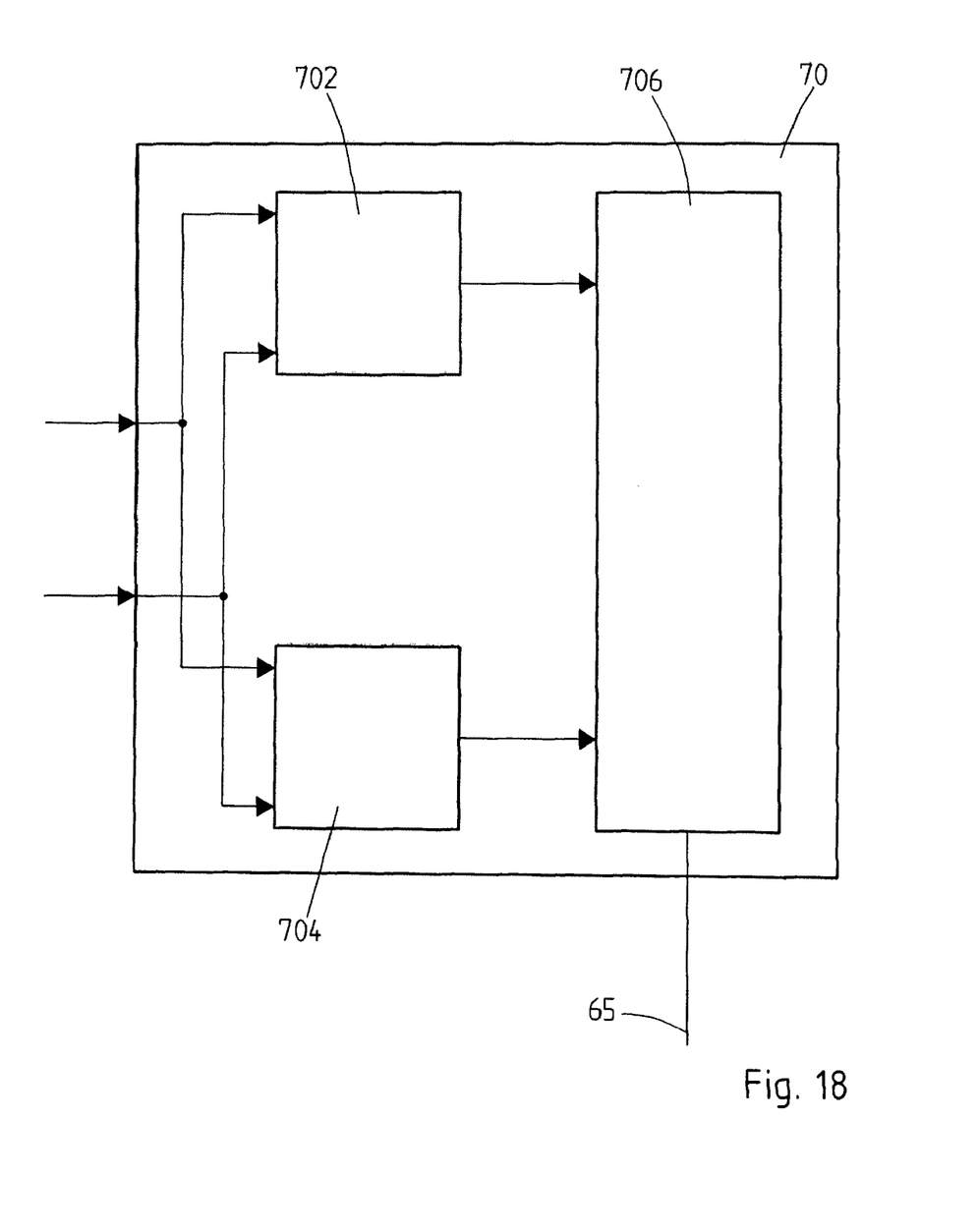
FIG. 18 schematically represents a frequency discriminator module comprised in the receiver of FIG. 17.

According to the invention, the discriminator module 70, now described with reference to the FIG. 18, comprises a frequency discriminator based on the HDFT or preferably on the HSDFT as described above. More particularly, the discriminator module 70 of the invention extracts at least two discrete spectral components of the incoming signal, preferably two spectral components corresponding to two frequencies $f_D$ and $f_U$, symmetrically placed above and under the zero frequency.

Each spectral component is extracted by frequency extraction means 702 or 704, which have a maximum response for the desired spectral component $f_D$, respectively $f_U$. The response naturally decreases for different frequencies, but in a manner that the response does not go to zero for any intermediate frequency between $f_D$ and $f_U$. In particular the response of the frequency extraction means 702 and 704 do not go to zero at the intermediate point f=0. In this manner one ensures the stable behaviour of the discriminator module 70 within its locking range.

Even more preferably, the frequency extraction means 702 and 704 have a frequency response that never goes to zero at any frequency. In this way the control loop including the discriminator module 70 and the NCO 40 has no spurious locking point, apart the designed one.

Thanks to this feature, the discriminator of the invention can extract a frequency error signal, obtained by the comparison means 706 which is arranged for calculating the difference of the absolute-value outputs of 702 and 704, and preferably for normalizing the difference by dividing it by the sum of the absolute-value outputs of frequency extraction means 702 and 704. In a further embodiment, the frequency extraction means will often consist of a software module, which contains code for calculating the values $H_D$ and $H_U$, when executed by a microprocessor. In an implementation variant, corresponding to the discriminator of equation 22) above, a supplementary extraction means, not represented, is used to extract the $HDFT_{centre}$ term.

Even if, for the sake of simplicity, this example shows the frequency extraction means 702 and 704 as separate entities, it is to be understood that the present invention may also comprise a single frequency extraction means, which extracts the two required spectral components $f_D$, $f_U$ in turn.

By using the HDFT and the HSDFT operators described above, the frequencies $f_D$ and $f_U$ are $f_D=-1/2NT$ to $f_U=1/2NT$, that is they are centred on half-integer values with respect to the natural binning of the sequence of the N incoming digital data $\{x_i\}$, which are sampled at a T sampling rate.

In a preferred embodiment, the frequency extraction means 702 and 704 implement the operators $H_D$ and $H_U$ that have the form set out in equation 17) above. However, the operators $H_D$ and $H_U$ may also be obtained, according to the present invention, from different mathematical operators, for extracting a frequency component of the incoming signal, as the circumstances may require.

The frequency discriminator of the invention is based on a variant of the DFT transform in which the usual twiddle factors are replaced with twiddle factors as for a DFT on a number of points which is the double as the actual number of sample points. The DFT so modified allows half-bin frequency discrimination, with little added computational burden. Two DFT shifted by a half bin with respect to the zero frequency provide a linear response of the discrimination and good immunity to noise. The frequency estimation and dynamics can be further improved by using both half-bin terms and full-bin terms in the discriminator function, the HSDFT being an example of this technique. The discriminator of embodiments of the invention is particularly useful in FLL for tracking signals in a GPS receiver.

According to the circumstances, the discriminator module 70 may be realized as a dedicated electronic digital circuit, or as a microcontroller device, programmed in a manner as to carry out the steps of the method of the invention. The invention also comprises software code, which can be loaded in the program memory of a computer device, for executing the steps of set forth above when the program is executed.

The invention claimed is:

1. A method comprising, with an apparatus having a receiver for receiving a radio frequency (RF) signal:
   obtaining a number of N successive samples associated with the RF signal;
   applying a discrete number of operators to the number of N successive samples to extract spectral components associated with the received RF signal;
   determining a lower frequency value for the extracted spectral components using a lower compound operator having a first transfer function with its maximum at a lower frequency that is below a reference frequency and which exhibits no zeros or discontinuities over an operating frequency range;
   determining an upper frequency value for the extracted spectral components using an upper compound operator having a second transfer function with its maximum at an upper frequency that is higher than the reference frequency and which exhibits no zeros or discontinuities in the operating frequency range;
   determining a frequency difference based, at least in part, on the lower frequency value and the upper frequency value; and
   providing the frequency difference to at least one module of the apparatus.

2. The method of claim 1, wherein at least one of the first or second transfer functions exhibits no zeros or discontinuities at any frequency.

3. The method of claim 1, wherein the upper frequency and the lower frequency are symmetrically placed around the reference frequency.

4. The method of claim 1, wherein the reference frequency comprises a zero frequency.

5. The method of claim 1, wherein at least one of the lower or upper frequency values represents an absolute value.

6. The method of claim 1, wherein at least one of the discrete number of operators performs either:
   a Discrete Fourier Transform (DFT) operation, obtained by a linear combination of the N successive samples, with weight factors taken from N distinct complex roots of unity of order N; or
   a Half-bin Discrete Fourier Transform (HDFT) operation, obtained by a linear combination of the N successive samples, with weight factors taken from 2N distinct complex roots of unity of order 2N.

7. The method of claim 1, wherein the frequency difference is determined based only on the lower and upper frequency values.

8. The method of claim 1, wherein at least one of the lower or upper compound operators combine extracted spectral components from at least one DFT operation with extracted spectral components from at least one HDFT operation.

9. The method of claim 8, wherein at least one of the discrete number of operators comprises a DFT operation corresponding to the reference frequency.

10. The method of claim 1, wherein the receiver comprises a GPS receiver.

11. The method of claim 1, wherein the frequency difference is represented by a frequency error signal and the at least one module comprises a variable frequency.

12. An apparatus for use with a device having a receiver for receiving a radio frequency (RF) signal, the apparatus comprising:
    means for obtaining a number of N successive samples associated with a received RF signal;
    means for extracting spectral components associated with the number of N successive samples using a discrete number of operators;
    means for determining a lower frequency value for the extracted spectral components using a lower compound operator having a first transfer function with its maximum at a lower frequency that is below a reference frequency and which exhibits no zeros or discontinuities over an operating frequency range;
    means for determining an upper frequency value for the extracted spectral components using an upper compound operator having a second transfer function with its maximum at an upper frequency that is higher than the reference frequency and which exhibits no zeros or discontinuities in the operating frequency range;
    means for determining a frequency difference based, at least in part, on the lower frequency value and the upper frequency value; and
    means for providing the frequency difference to at least one module of the device.

13. The apparatus of claim 12, wherein the reference frequency comprises a zero frequency.

14. The apparatus of claim 12, wherein the frequency difference is represented by a frequency error signal and the module comprises a variable frequency source.

15. The apparatus of claim 12, wherein at least one of the discrete number of operators performs at least one of:
   a Discrete Fourier Transform (DFT) operation, obtained by a linear combination of the N successive samples, with weight factors taken from N distinct complex roots of unity of order N; or
   a Half-bin Discrete Fourier Transform (HDFT) operation, obtained by a linear combination of the N successive samples, with weight factors taken from 2N distinct complex roots of unity of order 2N.

16. The apparatus of claim 12, wherein the frequency difference is determined based only on the lower and upper frequency values.

17. The apparatus of claim 12, wherein the receiver comprises a GPS receiver.

18. The apparatus of claim 12, wherein at least one of the first or second transfer functions exhibits no zeros or discontinuities at any frequency.

19. The apparatus of claim 12, wherein the upper frequency and the lower frequency are symmetrically placed around the reference frequency.

20. The apparatus of claim 12, wherein at least one of the lower or upper frequency values represents an absolute value.

21. The apparatus of claim 12, wherein at least one of the lower or upper compound operators combine extracted spectral components from at least one DFT operation with extracted spectral components from at least one HDFT operation.

22. The apparatus of claim 21, wherein at least one of the discrete number of operators comprises a DFT operation corresponding to the reference frequency.

23. An apparatus comprising:
   a receiver for receiving a radio frequency (RF) signal: and
   a frequency discriminator to:
      obtain a number of N successive samples associated with the RF signal;
      apply a discrete number of operators to the number of N successive samples to extract spectral components associated with the received RF signal;
      determine a lower frequency value for the extracted spectral components using a lower compound operator having a first transfer function with its maximum at a lower frequency that is below a reference frequency and which exhibits no zeros or discontinuities over an operating frequency range;
      determine an upper frequency value for the extracted spectral components using an upper compound operator having a second transfer function with its maximum at an upper frequency that is higher than the reference frequency and which exhibits no zeros or discontinuities in the operating frequency range; and
      determine a frequency difference based, at least in part, on the lower frequency value and the upper frequency value.

24. The apparatus of claim 23, wherein at least one of the first or second transfer functions exhibits no zeros or discontinuities at any frequency.

25. The apparatus of claim 23, wherein the upper frequency and the lower frequency are symmetrically placed around the reference frequency.

26. The apparatus of claim 23, wherein the reference frequency comprises a zero frequency.

27. The apparatus of claim 23, wherein at least one of the lower or upper frequency values represents an absolute value.

28. The apparatus of claim 23, wherein at least one of the discrete number of operators performs either:
   a Discrete Fourier Transform (DFT) operation, obtained by a linear combination of the N successive samples, with weight factors taken from N distinct complex roots of unity of order N; or
   a Half-bin Discrete Fourier Transform (HDFT) operation, obtained by a linear combination of the N successive samples, with weight factors taken from 2N distinct complex roots of unity of order 2N.

29. The apparatus of claim 23, wherein the frequency difference is determined based only on the lower and upper frequency values.

30. The apparatus of claim 23, wherein at least one of the lower or upper compound operators combine extracted spectral components from at least one DFT operation with extracted spectral components from at least one (HDFT) operation.

31. The apparatus of claim 30, wherein at least one of the discrete number of operators comprises a DFT operation corresponding to the reference frequency.

32. The apparatus of claim 23, wherein the receiver comprises a GPS receiver.

33. The apparatus of claim 23, wherein the frequency difference is represented by a frequency error signal for use by a variable frequency associated with the receiver.

34. An article comprising:
   a computer readable storage medium having stored therein computer-implementable instructions executable by a device to:
      obtain a number of N successive samples associated with a received radio frequency (RF) signal;
      apply a discrete number of operators to the number of N successive samples to extract spectral components associated with the received RF signal;
      determine a lower frequency value for the extracted spectral components using a lower compound operator having a first transfer function with its maximum at a lower frequency that is below a reference frequency and which exhibits no zeros or discontinuities over an operating frequency range;
      determine an upper frequency value for the extracted spectral components using an upper compound operator having a second transfer function with its maximum at an upper frequency that is higher than the reference frequency and which exhibits no zeros or discontinuities in the operating frequency range;
      determine a frequency difference based, at least in part, on the lower frequency value and the upper frequency value; and
      provide the frequency difference to at least one module of the device.

35. The article of claim 34, wherein at least one of the first or second transfer functions exhibits no zeros or discontinuities at any frequency.

36. The article of claim 34, wherein the upper frequency and the lower frequency are symmetrically placed around the reference frequency.

37. The article of claim 34, wherein the reference frequency comprises a zero frequency.

38. The article of claim 34, wherein at least one of the lower or upper frequency values represents an absolute value.

39. The article of claim 34, wherein at least one of the discrete number of operators performs either:

a Discrete Fourier Transform (DFT) operation, obtained by a linear combination of the N successive samples, with weight factors taken from N distinct complex roots of unity of order N; or a Half-bin Discrete Fourier Transform (HDFT) operation, obtained by a linear combination of the N successive samples, with weight factors taken from 2N distinct complex roots of unity of order 2N.

40. The article of claim 34, wherein the frequency difference is determined based only on the lower and upper frequency values.

41. The article of claim 34, wherein at least one of the lower or upper compound operators combine extracted spectral components from at least one DFT operation with extracted spectral components from at least one (HDFT) operation.

42. The article of claim 41, wherein at least one of the discrete number of operators comprises a DFT operation corresponding to the reference frequency.

43. The article of claim 34, wherein the device comprises a GPS receiver.

44. The article of claim 43, wherein the frequency difference is represented by a frequency error signal for use by a variable frequency associated with the GPS receiver.

* * * * *